(12) United States Patent
Blanchard et al.

(10) Patent No.: US 6,621,107 B2
(45) Date of Patent: Sep. 16, 2003

(54) TRENCH DMOS TRANSISTOR WITH EMBEDDED TRENCH SCHOTTKY RECTIFIER

(75) Inventors: Richard A. Blanchard, Los Altos, CA (US); Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/938,253

(22) Filed: Aug. 23, 2001

(65) Prior Publication Data

US 2003/0040144 A1 Feb. 27, 2003

(51) Int. Cl.[7] ............................................. H01L 29/74
(52) U.S. Cl. ...................... 257/155; 257/330; 257/331; 257/341; 438/268; 438/270
(58) Field of Search ................................. 257/155, 341, 257/342, 331, 330; 438/270, 268, 272

(56) References Cited

U.S. PATENT DOCUMENTS

| | | | |
|---|---|---|---|
| 4,811,065 A | 3/1989 | Cogan | 357/23.4 |
| 4,823,172 A | 4/1989 | Mihara | 357/15 |
| 4,904,613 A | 2/1990 | Coe et al. | 437/41 |
| 4,982,260 A | 1/1991 | Chang et al. | 357/38 |
| 5,072,266 A | 12/1991 | Bulucea et al. | 357/23.4 |
| 5,598,016 A | 1/1997 | Tanabe et al. | 257/229 |
| 5,686,750 A * | 11/1997 | Takahashi | 257/328 |
| 5,915,179 A | 6/1999 | Etou et al. | 438/268 |
| 6,049,108 A * | 4/2000 | Williams et al. | 257/341 |
| 6,351,018 B1 | 2/2002 | Sapp | 257/499 |

* cited by examiner

Primary Examiner—Olik Chaudhuri
Assistant Examiner—Hsien-Ming Lee
(74) Attorney, Agent, or Firm—Mayer Fortkort & Williams, PC; David B. Bonham, Esq.; Karin L. Williams, Esq.

(57) ABSTRACT

A merged device is that comprises a plurality of MOSFET cells and a plurality of Schottky rectifier cells, as well as a method of designing and making the same. According to an embodiment of the invention, the MOSFET cells comprise: (a) a source region of first conductivity type formed within an upper portion of a semiconductor region, (b) a body region of second conductivity type formed within a middle portion of the semiconductor region, (c) a drain region of first conductivity type formed within a lower portion of the semiconductor region, and (d) a gate region provided adjacent the source region, the body region, and the drain region. The Schottky diode cells in this embodiment are disposed within a trench network and comprise a conductor portion in Schottky rectifying contact with the lower portion of the semiconductor region. At least one MOSFET cell gate region is positioned along a sidewall of the trench network and adjacent at least one Schottky diode cell in this embodiment.

26 Claims, 13 Drawing Sheets

US 6,621,107 B2

TRENCH DMOS TRANSISTOR WITH EMBEDDED TRENCH SCHOTTKY RECTIFIER

STATEMENT OF RELATED APPLICATION

This case is related to application Ser. No. 09/684,931 filed Oct. 6, 2000 and entitled "Trench DMOS Transistor with Embedded Trench Schottky Rectifier".

FIELD OF THE INVENTION

The present invention relates to merged devices comprising power MOSFETs in parallel with Schottky barrier rectifiers. More particularly, the present invention relates to the merging of trench MOSFETs and trench Schottky rectifiers into single devices, either on a single semiconductor substrate or as components in a larger integrated circuit.

BACKGROUND OF THE INVENTION

Power MOSFETs (metal oxide semiconductor field effect transistors) are well-known structures and are provided in a number of configurations, including the "vertical" DMOS transistor configuration illustrated in FIG. 1 and the "trench" DMOS transistor configuration illustrated in FIG. 2. Each of the configurations shown includes a highly doped substrate 100 (shown as an N+ region) on which is grown a lightly doped epitaxial layer 102 (shown as an N– region), which perform the drain function for the device. P-type body regions 104 (shown as P+/P and P– regions in FIGS. 1 and 2, respectively) are provided within the epitaxial layer 102, as are source regions 112 (shown as N+ regions). The device gates consist of conductive regions 111 and oxide regions 110. A drain contact D is connected to the back surface of the semiconductor substrate 100, a source and body contact SB is connected to the source regions 112 and body regions 104, and a gate electrode G is connected to the conductive regions 111. When a potential difference is applied across the body and the gate, charges are capacitively induced within the body region 104 adjacent to the gate oxide layer 110, resulting in the formation of an N-type channel on the surface of the body region 104 adjacent to the gate of the DMOS cell. When another potential difference is applied across the source 112 and the drain 102,100, carriers flow from the source to the drain through the channel as illustrated by the arrows in FIGS. 1 and 2, and the DMOS cell is said to be in a power-on state.

Power MOSFETs like those shown in FIGS. 1 and 2 are often used in circuits that require a Schottky diode in parallel with the MOSFET. See, e.g., U.S. Pat. Nos. 4,823,172 and 6,049,108. Such a circuit configuration is shown schematically in FIG. 3. As can be seen from this figure, the low forward voltage drop of the Schottky diode 1 prevents the body-to-drain pn-junction diode 2 that is inherent in the DMOS structure from becoming forward biased when the source-to-drain voltage becomes positive. As a result, any current that does flow in the circuit of FIG. 3 under these circumstances will flow through the Schottky diode.

By preventing the body-to-drain pn-junction diode from turning "on", the injection of minority carriers across the body-to-drain junction is prevented. If present, such minority carriers will delay a junction diode from turning "off" until all the carriers are either swept across the junction or they recombine after the voltage across the junction is reversed. The associated turn-off delay time limits the maximum frequency at which the MOSFET can operate.

On the other hand, the arrangement shown in FIG. 3 allows essentially all of the current to flow through the Schottky diode. In contrast to the inherent body-to-drain pn-junction diode 2, there is no turn-off delay associated with the Schottky diode 1, because it is not a minority carrier device.

SUMMARY OF THE INVENTION

According to an embodiment of the invention, a merged device is provided, which comprises (1) a plurality of MOSFET cells that comprise: (a) a source region of first conductivity type formed within an upper portion of a semiconductor region, (b) a body region of second conductivity type formed within a middle portion of the semiconductor region, (c) a drain region of first conductivity type formed within a lower portion of the semiconductor region, and (d) a gate region provided adjacent the source region, the body region, and the drain region and (2) a plurality of Schottky diode cells disposed within a trench network, which Schottky diode cells comprise a conductor portion in Schottky rectifying contact with the lower portion of the semiconductor region. In this embodiment, at least one MOSFET cell gate region is positioned along a sidewall of the trench network and adjacent at least one Schottky diode cell.

According to another embodiment of the invention, a merged device is provided that comprises: (1) a semiconductor substrate of first conductivity type; (2) a semiconductor epitaxial layer disposed over the substrate; (3) a trench network extending into the epitaxial region from an upper surface of the epitaxial layer and forming a plurality of mesas within the device; (4) a plurality of MOSFET cells that comprise: (a) a source region of the first conductivity type disposed within one of the mesas, (b) a body region of second conductivity type disposed within the one of the mesas, wherein the body region forms a junction with the source region, (c) a drain region of first conductivity type at least partially disposed within the one of the mesas, wherein the drain region forms a junction with the body region; and (d) a gate region situated within the trench network such that it is adjacent the source region, the body region and the drain region, wherein the gate region comprises (i) an insulating region lining at least a portion of the trench network and (ii) a conductive region within the trench network adjacent the insulating region, the conductive region being separated from the source, body and drain regions by the insulating region; and (5) a plurality of Schottky dioide cells, which Schottky dioide cells are formed over bottom portions of the trench network and comprise a conductor portion that is in Schottky barrier rectifying contact with the epitaxial layer. The merged device of this embodiment is configured such that at least some of the MOSFET cell gate regions are positioned along sidewalls of the trench network adjacent the conductor portions of at least some of the Schottky diodes.

Certain preferred embodiments include one or more of the following characteristics: (a) the semiconductor is silicon, (b) the first conductivity type is n-type conductivity and the second conductivity type is p-type conductivity, (c) the gate region comprises a doped polysilicon region adjacent a silicon dioxide region, (d) the conductor comprises one or more of titanium tungsten, platinum silicide, aluminum and aluminum alloy, (e) the body region of the device comprises a heavily doped contact region, and (f) the device comprises a p-type region that is below the Schottky diode and in contact with the perimeter of the Schottky diode.

In some embodiments, at least some of the said MOSFET cells and at least some of the Schottky diode cells are arranged in a geometric configuration that is selected from an in-line square geometry, an offset square geometry, and a hexagonal geometry.

In other embodiments, at least some of the MOSFET cells are octagonal cells. For example, at least some of the MOSFET cells and at least some of the Schottky diode cells can be arranged in a geometry that comprises alternating first and second cell rows, in which the cells of the first cell rows are greater in area than the cells of the second cell rows, and in which the cells of the first cell rows are octagonal cells. The octagonal cells can be, for example, regular octagons. The MOSFET cells can be positioned, for example, in the first cell rows, and the Schottky diode cells can be positioned, for example, within the second cell rows. Cells of the second cell rows can include, for example, octagonal cells or square cells.

According to another embodiment of the invention, a merged device is provided that comprises Schottky diode cells and MOSFET cells. In this embodiment, the Schottky diode cells are located at the bottom of a trench network, while certain gate regions of the MOSFET cells are provided on sidewalls of the trench network.

According to another embodiment of the invention, a method of forming a merged device is provided. The method comprises forming a plurality of Schottky diode cells and forming a plurality of MOSFET cells, such that: (a) the Schottky diode cells are located at the bottom of a trench network, (b) the gate regions of the MOSFET cells comprise a conductive region and an insulating region, (c) certain of the gate regions are provided on sidewalls of the trench network, and (d) the conductive regions of the gate regions are formed without the aid of a masking layer, preferably by etching a doped polysilicon layer using an anisotropic etching process.

According to another embodiment of the invention, a method for designing a merged device, which comprises a plurality of Schottky diode cells and a plurality of MOSFET cells, is provided. The method comprises: (1) removing one or more source/body mesas within a trench MOSFET device design and (2) locating one or more Schottky diode cells where the removed mesa was formerly located.

One advantage of the present invention is that a merged device is provided that contains both a DMOS transistor and a Schottky diode integrated on the same substrate.

Another advantage of the present invention is that the DMOS transistor and Schottky diode portions of the merged device can be created in an integrated manufacturing process, rather than being created sequentially.

Another advantage of the present invention is that a merged device is provided that optimizes surface area utilization by incorporating DMOS transistor function into the sidewalls of the trenches that are used to provide the Schottky diode function of the device.

Another advantage of the present invention is that the geometry of the device can be selected to vary the ratio of DMOS source perimeter to Schottky diode conducting area, optimizing device performance.

Yet another advantage of the present invention is that the ratio of DMOS source perimeter to Schottky-diode conducting area can be varied across the device, optimizing device performance at edges and as a function of temperature.

Still other embodiments and advantages of the present invention will become readily apparent to those skilled in the art upon review of the Detailed Description, Examples and Claims set forth below.

DETAILED DESCRIPTION OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 1:
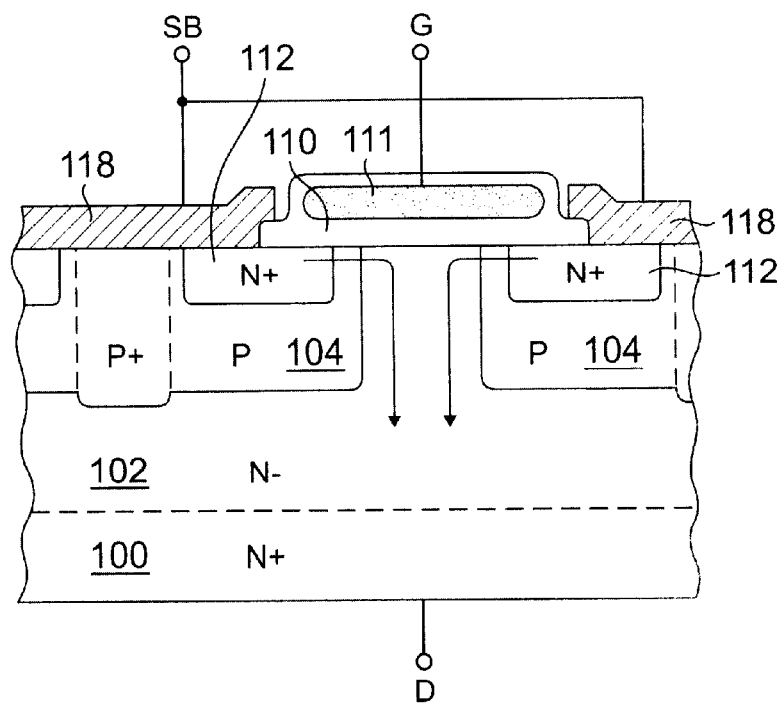
FIG. 1 shows a schematic cross-sectional view of a vertical power MOSFET of the prior art.
Figure 2:
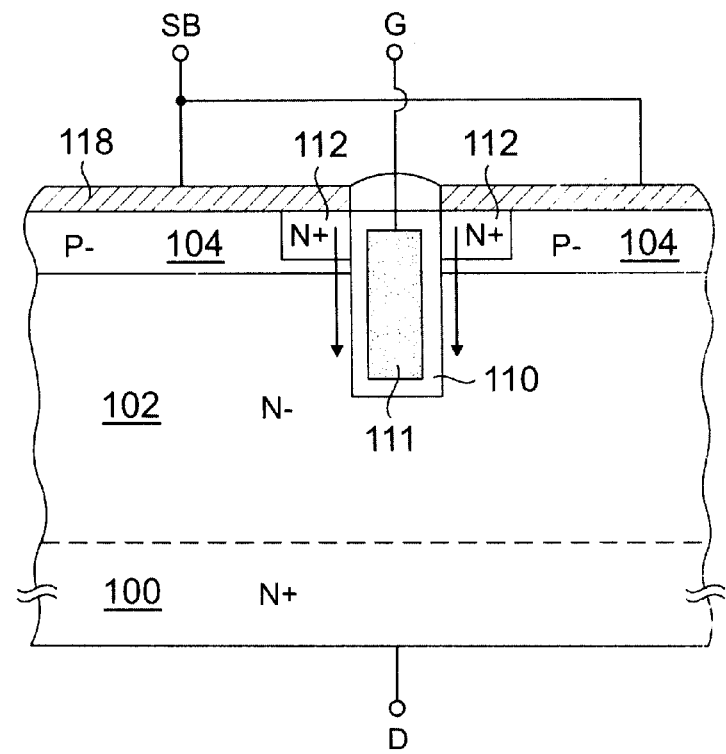
FIG. 2 shows a schematic cross-sectional view of a trench power MOSFET of the prior art.
Figure 3:
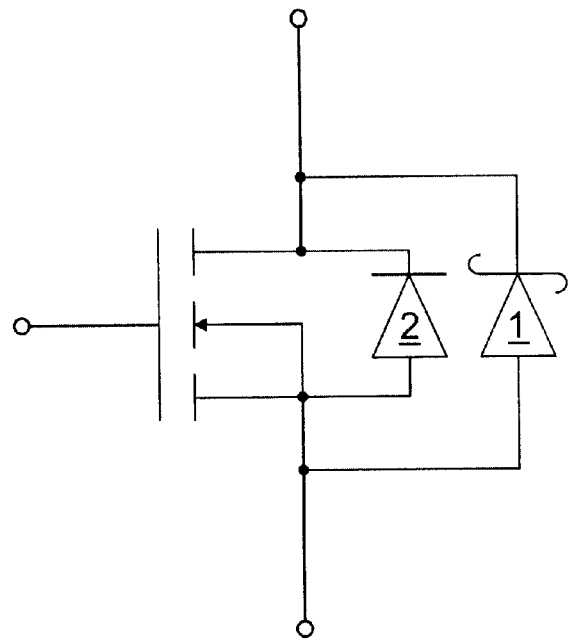
FIG. 3 is a schematic circuit diagram of a power MOSFET in parallel with a Schottky diode, as is known in the prior art.
Figure 4A:
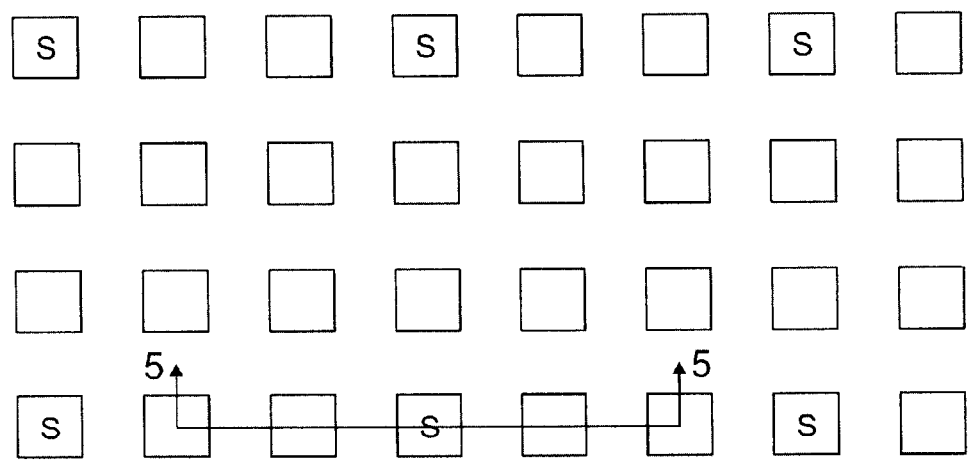
FIGS. 4A–4E are schematic top views illustrating five cell geometries that may be used in connection with the merged MOSFET and Schottky diode structures of the present invention.
Figure 4B:
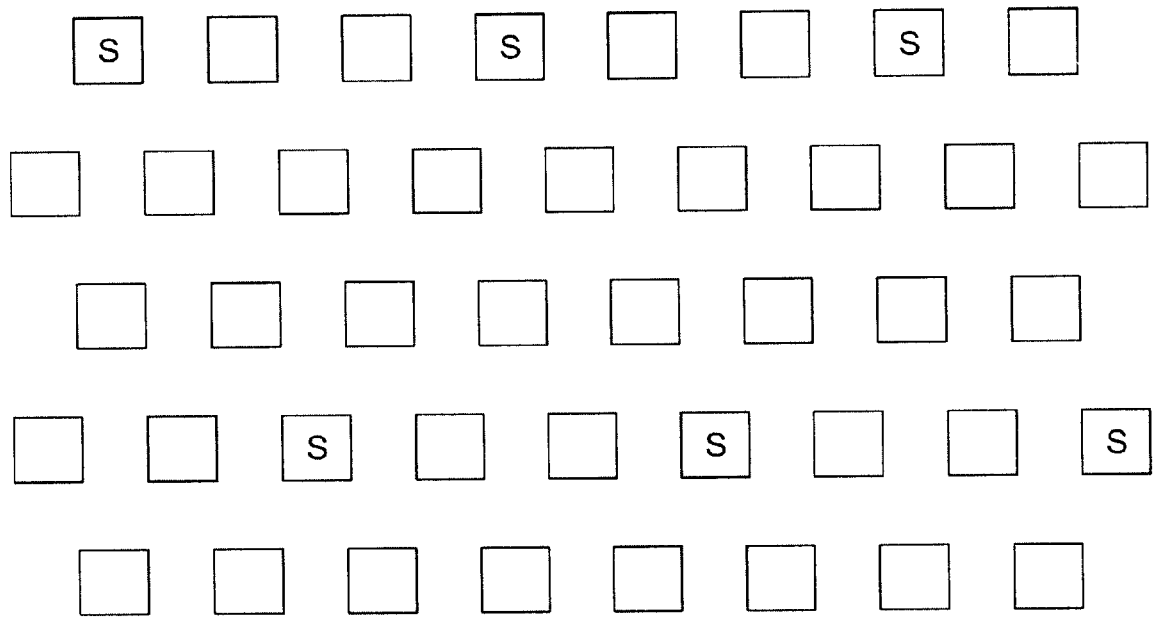
Figure 4C:
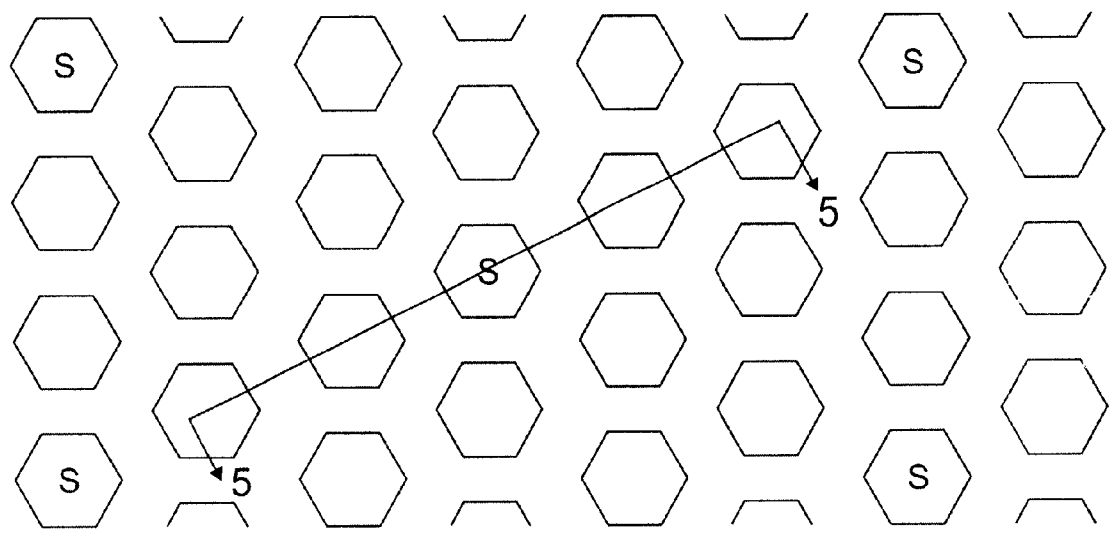

The device design of the present invention can be implemented in connection with an essentially infinite variety of layouts in which numerous DMOS transistors and Schottky diodes are integrated on the same silicon substrate. Schematic top views of five possible layouts are illustrated in FIGS. 4A–4E. The portions of the device that are marked with an "S" correspond to the Schottky cell portions of the device. The remaining portions of the device that are not marked correspond to mesas of the trench MOSFET cell portions of the device. The geometry illustrated in FIG. 4A is referred to herein as an "in-line square geometry", that of FIG. 4B is referred to herein as an "offset square geometry", and that of FIG. 4C is referred to herein as a "hexagonal geometry" or "honeycomb geometry". The geometry in FIG. 4D converts the two DMOS mesas in the geometry of FIG. 4A to a Schottky diode region, while the geometry in FIG. 4E converts four DMOS mesas to a Schottky diode. Each of these designs takes advantage of the square and hexagonal cell configurations that are commonly practiced in the MOSFET art.

Figure 4D:
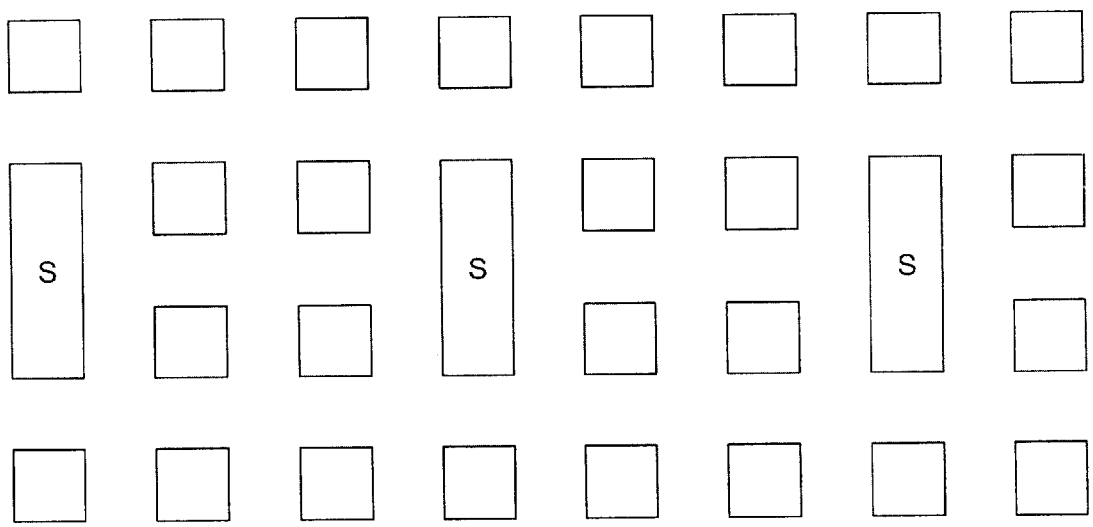
Figure 4E:
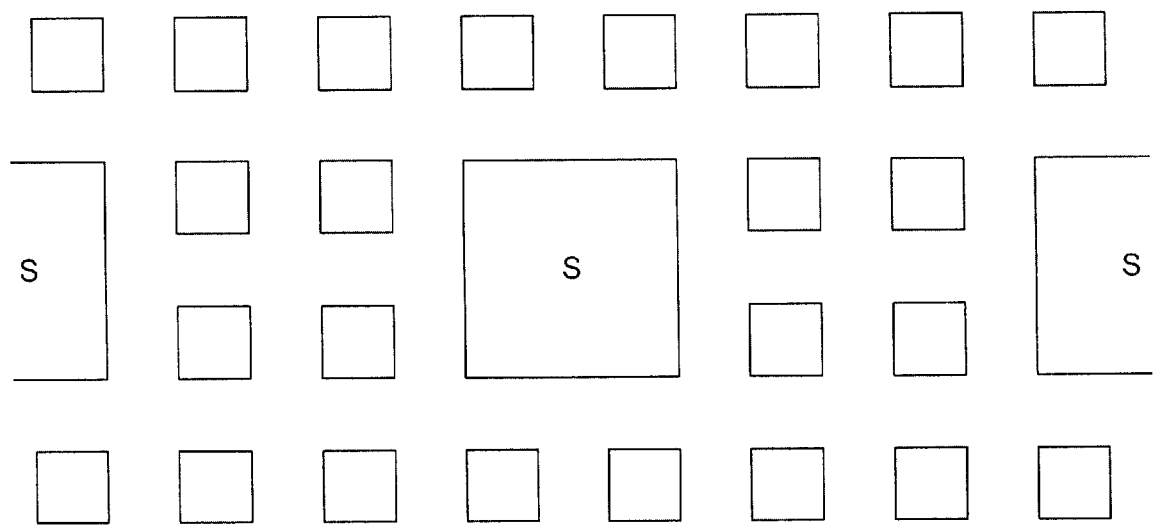
Figure 5:
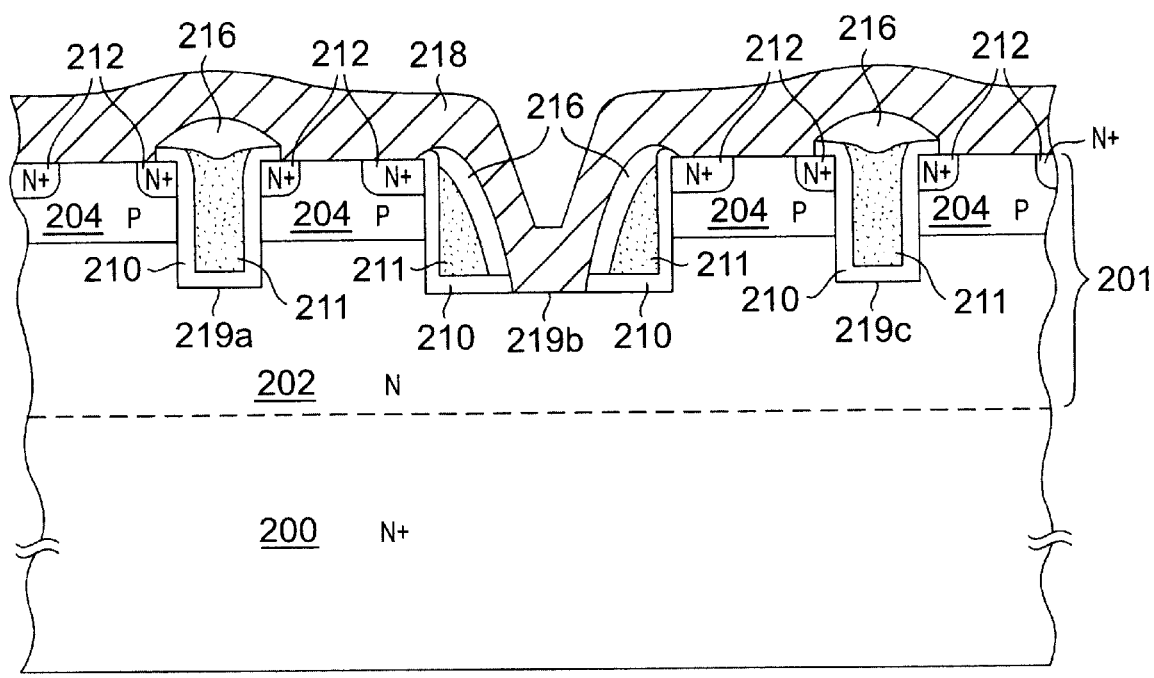
FIG. 5 is a schematic cross-sectional view of a merged MOSFET and Schottky diode structure, in accordance with an embodiment of the present invention. The view in FIG. 5 is like that taken along line 5—5 in FIG. 4A or along line 5—5 in FIG. 4C.

As will be appreciated from FIG. 5 to follow, an enlarged trench region is provided in the Schottky cell areas, rather than a mesa structure. Moreover, where the area of a single DMOS mesa is converted to Schottky diode area, there are a maximum theoretical number of DMOS cells that can be replaced by Schottky cells, without substantially interrupting gate conductor access. (It is also possible to convert two or more contiguous DMOS mesas to Schottky diodes as shown in FIGS. 4D and 4E.) Of course, the number of Schottky cells may be lower than the theoretical maximum, so long as the amount of Schottky diode current associated with the device is acceptable.

FIG. 5 is a schematic cross-sectional view of a merged MOSFET and Schottky diode structure in accordance with an embodiment of the present invention. The view in FIG. 5 is like that taken along line 5—5 in FIG. 4A or along line 5—5 in FIG. 4C.

The device illustrated includes an epitaxial layer 201, which is provided on an N+ substrate 200. While the substrate 200 and epitaxial layer 201 can be formed from any semiconductor material, silicon is presently preferred.

The N+ substrate 200 in this specific example has a thickness ranging, for example, from 8 mils to 40 mils and a net doping concentration ranging, for example, from $1 \times 10^{19}$ to $5 \times 10^{20}$ cm$^{-3}$.

An N region 202 is found in the lower portion of the epitaxial layer 201. In this example, N region 202 has a thickness ranging, for example, from 1 to 20 microns and a net doping concentration ranging, for example, from $10^{13}$ to $10^{16}$ cm$^{-3}$.

P-body regions 204 are found in the upper portion of epitaxial layer In the example shown, these P-body regions 204 extend, for example, to a depth of 0.3 to 5.0 microns from the upper surface of the epitaxial layer 201 and have a peak doping concentration ranging, for example, from $10^{16}$ to $10^{20}$ cm$^{-3}$ if not uniformly doped and from $1 \times 10^{15}$ to $5 \times 10^{16}$ cm$^{-3}$ if uniformly doped. These P body regions 204 provide the channel region for the trench MOSFET cells of the device.

N+ regions 212 are also found in the upper portion of epitaxial layer These regions extend, for example, to a depth of 0.2 to 3.5 microns from the epitaxial layer 201 surface and have peak doping concentrations ranging, for example, from $10^{19}$ to $5 \times 10^{20}$ cm$^{-3}$. These N+ regions 212 provide the source electrode function of the trench MOSFET cells of the device.

Three trenches 219a, 219b, 219c are shown in FIG. 5, each of which extends, for example, to a depth of 0.3 to 4.0 microns from the upper surface of the epitaxial layer 201. The left trench 219a and the right trench 219c are completely dedicated to the MOSFET function of the device and are referred to herein as "MOSFET trenches". These trenches are, for example, 0.4 to 2.0 microns in width. The regions between the trenches 219a–c are frequently referred to as "mesas" or "trench mesas", based on their shapes. These regions range, for example, from 2.0 to 10.0 microns in width and can be of various geometries as seen, for example, from FIGS. 4A–4E.

The left and right trenches 219a, 219c that are dedicated to the MOSFET function of the device are lined with an insulator 210, typically an oxide insulator such as silicon oxide. Where silicon oxide (typically silicon dioxide) is used as the insulator 210, it can range, for example, from 100 to 2000 Angstroms in thickness. Adjacent the insulator 210 is a conductive region 211, which is typically doped polycrystalline silicon. Where polycrystalline silicon is used as the conductor 211, it can have a sheet resistance of, for example, 5 to 100 ohms/square. Together, the insulator 210 and conductive region 211 provide the gate electrode function of the trench MOSFET cells of the device.

The center trench 219b is substantially wider than trenches 219a and 219c, for example, from 2.8 to 14.0 microns in width. (As a brief aside, it is noted that the drawings in this application are not to scale, as is common for drawings that are of a schematic nature. This is particularly true with respect to trench 219b, which according to the geometry of the device has a width equal to two MOSFET trench widths 219a, 219c plus a mesa width. Trench 219b is illustrated in FIG. 5 as being significantly narrower than this amount.) A MOSFET function is associated with the left and right sides of trench 219b, while a Schottky diode function is associated with the center of trench 219b. Accordingly, trench 219b may be referred to as a "hybrid trench". The regions of the trench 219b having MOSFET functions can be identified by the presence of sources 212, separated from the drain (N-epitaxial region 202) by body regions 204. A channel can be created within the body region 202 by properly biasing the gate (which includes conductive region 211 and insulator 210).

The region of the trench 219b having the Schottky diode function can be identified by the presence the contact between the conductor 218 and the N-epitaxial region 202 that occurs there. This contact is a Schottky rectifying contact. The height of the Schottky barrier associated with this contact depends, for example, upon the type of conductor and semiconductor material used as well as the doping concentration within the semiconductor.

Conductor 218 also serves as the source and body conductor for the trench MOSFET portions of the device, shorting all the source regions 212 and body regions 204 together. The contact between the conductor 218 and the source and body regions 212, 204 is an ohmic contact.

Titanium tungsten, platinum silicide, aluminum or a film containing two or more of these materials are some preferred materials for conductor 218 as they are capable of providing (a) a Schottky rectifying contact with the N-epitaxial region 202 and (b) an ohmic contact with both the source regions 212 and the body regions 204.

Insulating regions 216, typically silicon dioxide and/or BPSG (borophosphosilicate glass) regions, prevent the doped polycrystalline silicon regions 211 associated with the MOSFET gate function of the device from being shorted through the conductor 218 to the N+ source regions 212 and the body regions 204.

A conductor (not shown) is also typically provided adjacent the N+ substrate 200. This conductor acts both as the drain conductor for the MOSFET portions of the device and the cathode conductor for the Schottky diode portions. Another conductor (not shown) is also typically connected to a gate runner portion of the polycrystalline silicon 211 located outside of the active area of the device.

Hence, in the merged device of the present invention, both trench MOSFETs and Schottky diodes are integrated into the same piece of silicon. This design provides efficient use for the available surface area of the device. For example, as previously noted, the trench 219b containing the Schottky diode portion of the device shown in FIG. 5 also has the feature that trench MOSFETs are incorporated into its sidewalls. In addition, this design further reduces costs by providing shared overhead (pads, perimeters, etc.) among the Schottky diode and trench MOSFET cells. Furthermore, the current in the device is relatively evenly distributed (leading, for example, to thermal advantage) with current flowing where desired (reducing, for example, inductive losses at high frequencies). This process further allows the Schottky diodes and the trench MOSFETs to the formed using common process steps in an integrated process scheme.

Figure 6A:
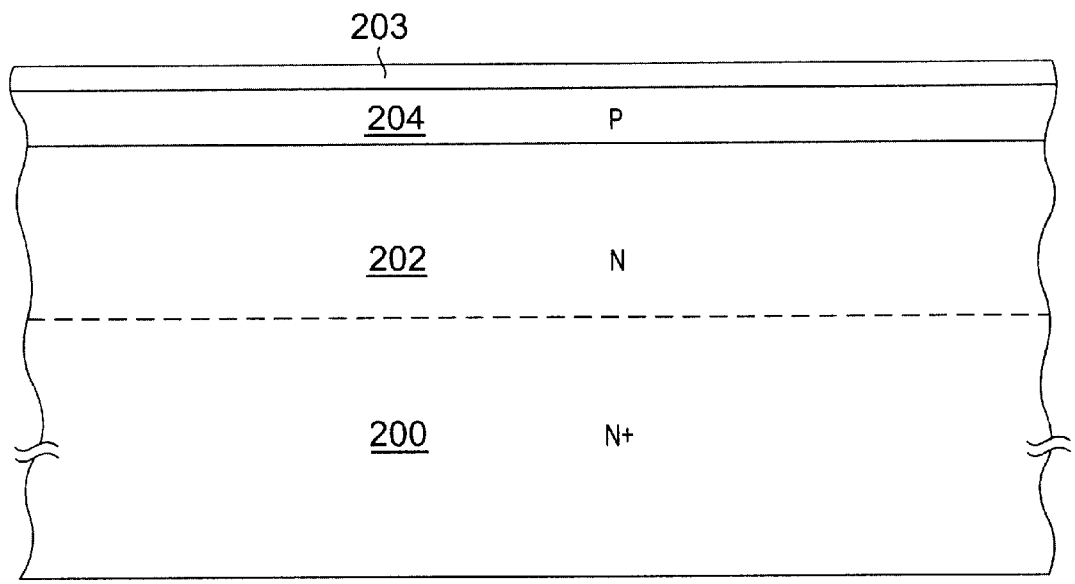
FIGS. 6A–6F illustrate a process for forming a device like that shown in FIG. 4, in accordance with an embodiment of the present invention.

FIGS. 6A to 6F illustrate a series of steps that can be performed to form the device depicted in FIG. 5. Referring now to FIG. 6A, an N-doped epitaxial layer 202 is first grown on a conventionally N+ doped substrate 200. Epitaxial layer can range, for example, from 1.3 to 25 microns in thickness. Next a body implant step is performed. For example, the upper surface of the epitaxial layer can be implanted with boron at 5 to 200 keV at a dosage of $10^{13}$ to $5 \times 10^{15}/cm^2$. Subsequently, an oxide layer 203 is formed over the surface, for example, by wet or dry oxidation at 800 to 1200° C. for 1 to 200 minutes. The oxide layer 203 can be, for example, from 500 to 10,000 Angstroms thick. In addition to forming oxide layer 203, this step acts to diffuse the implanted dopant into the epitaxial layer 202 to form region 204. In this case, the region 204 is a P-type region having a peak doping concentration of $10^{16}$ to $10^{20}$ cm$^{-3}$ and a depth of 0.3 to 5.0 microns. The resulting structure is illustrated in FIG. 6A.

Figure 6B:
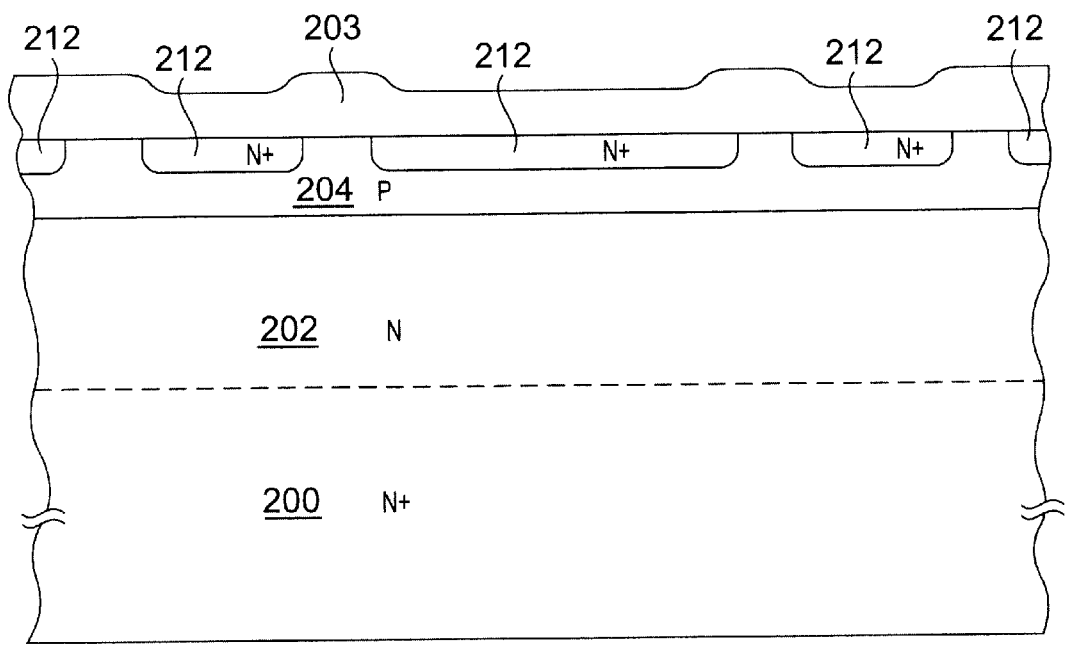

A source mask is then formed from oxide layer 203 by first providing a patterned photoresist layer (not shown) over layer 203, followed by etching, for example using a wet or a plasma etching step, to remove the oxide in areas not covered by the photoresist. A source implant is then performed. For example, arsenic or phosphorous can be implanted at 5 to 200 keV and a dosage of $5 \times 10^{14}$ to $1 \times 10^{16}/cm^2$. A wet or dry oxidation step is then performed, for example, at 800 to 1200° C. for 1 to 200 minutes, forming an oxide layer of 500 to 5000 Angstroms in thickness in the areas where the oxide was previously removed. This step also diffuses the source dopant, producing source regions 212 having a peak doping concentration of $10^{19}$ to $5 \times 10^{20}$ cm$^{-3}$ and a depth of 0.2 to 3.5 microns. The resulting structure is illustrated in FIG. 6B.

A trench mask (not shown) is then provided over the oxide layer 203, after which trenches are etched, for example by plasma or reactive ion etching, to a depth typically ranging from 0.3 to 4.0 microns. This produces distinct P-body regions 204 and source regions 212. The trench mask is then removed, and a sacrificial oxide layer is then grown and removed as is known in the art. Subsequently, a gate oxide layer 210, ranging, for example, from 100 to 2000 Angstroms in thickness is grown within the trenches, for example, by wet or dry oxidation at 900 to 1200° C. for 1 to 60 minutes.

Figure 6C:
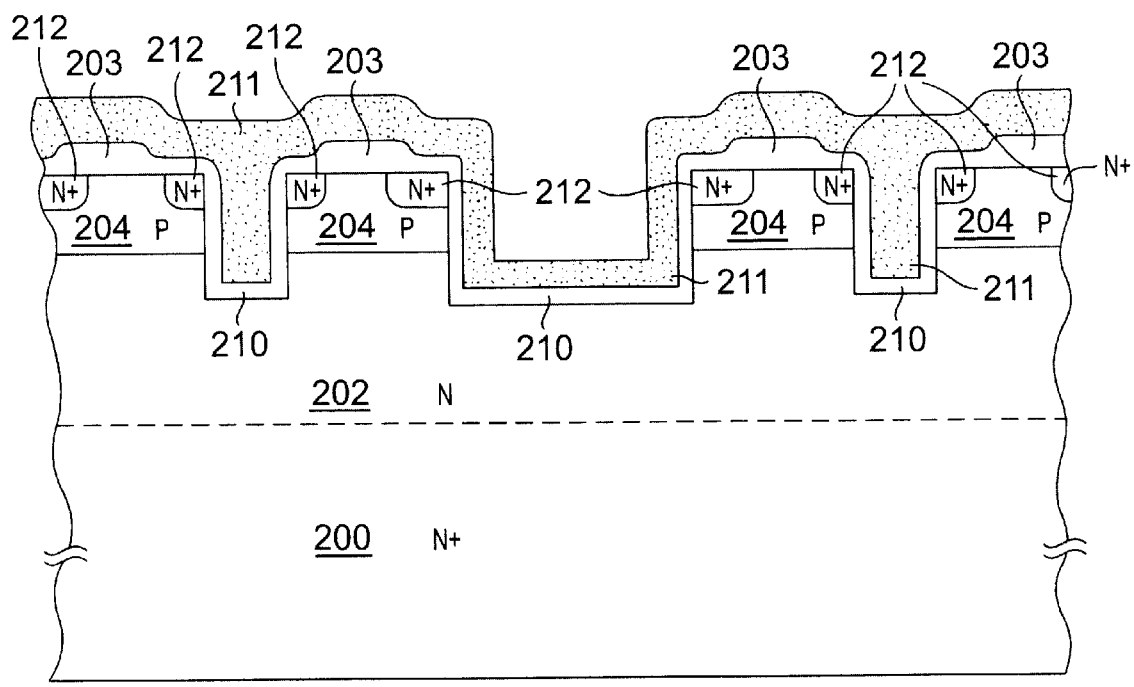
Figure 6D:
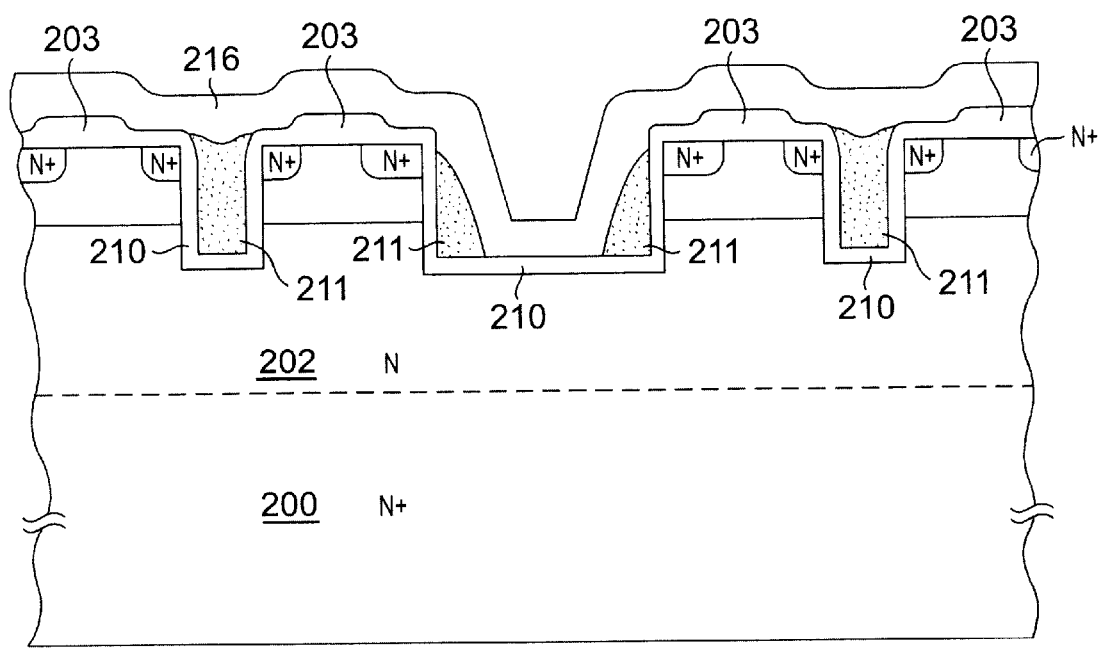
Figure 6E:
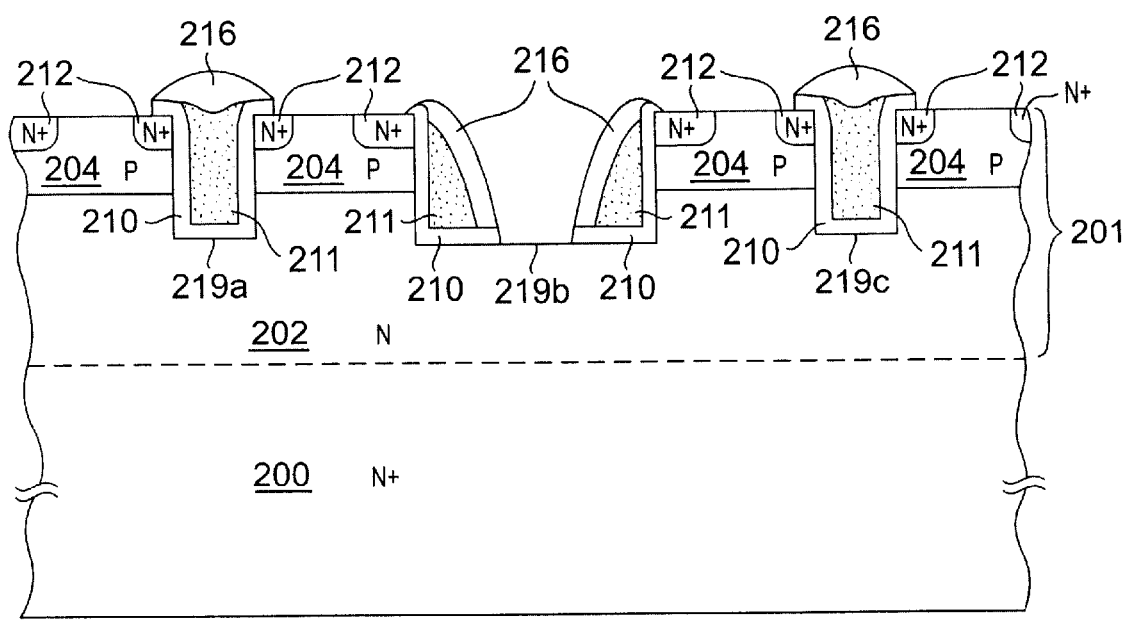

The surface of the structure is then covered, and the trenches are filled, with a polycrystalline silicon layer 211, preferably using CVD. The polycrystalline silicon is typically doped N-type to reduce its resistivity. N-type doping can be carried out, for example, during CVD with phosphine gas, by thermal predeposition using phosphorous oxychloride, or by implantation with arsenic or phosphorous. The resulting structure is illustrated in FIG. 6C.

After appropriate masking outside of the active region to preserve polycrystalline silicon for gate contact, the polycrystalline silicon layer is then subjected to an anisotropic etching step, for example, a plasma or reactive ion etching step, forming distinct polycrystalline silicon regions 211, which are connected within trenches that are out of the plane of the particular cross-section illustrated. The mask is then removed, and an oxide layer 216 is deposited, producing the structure illustrated in FIG. 6D.

Figure 7:
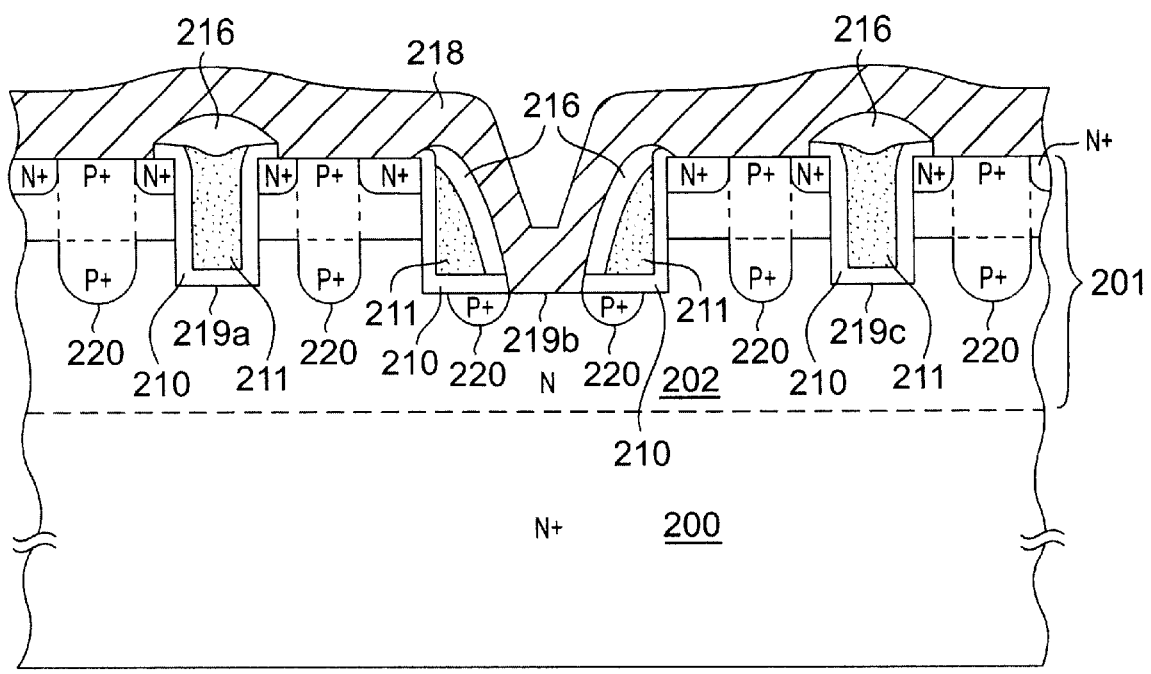
FIG. 7 is a schematic cross-section of a merged MOSFET and Schottky diode structure that includes deep p+ regions for low resistance contacts to the body regions and to surround the perimeter of the Schottky diode.

A contact mask (i.e., a photoresist layer—not shown) is then provided, after which contact areas are opened in the oxide by an oxide etching step, consisting for example of a wet or plasma etch. This step provides contact areas corresponding to source/body contacts, Schottky rectifying contacts and gate contacts outside the active area. As with the polysilicon etch step, an anisotropic etch may be used to avoid the need for photoresist on the sloped polysilicon sidewalls in the center trench. The contact mask is then removed to produce the structure of FIG. 6E. If desired, P+ regions (not shown) can be formed in upper portions of body regions 204, using an additional mask, to establish a good ohmic contact with the conductor 218 that is subsequently provided. If sufficiently deep, these P+ regions may also be formed around the perimeter of the Schottky diode. The resulting structure is shown in FIG. 7. It is also possible to form P+ regions that just provide low resistance contacts to the body regions, or just provide p-doped regions that surround the Schottky diodes. In FIG. 7, the P+ regions 220 provide both low resistance contacts and p-doped regions around the Schottky diodes, which increases breakdown.

Figure 6F:
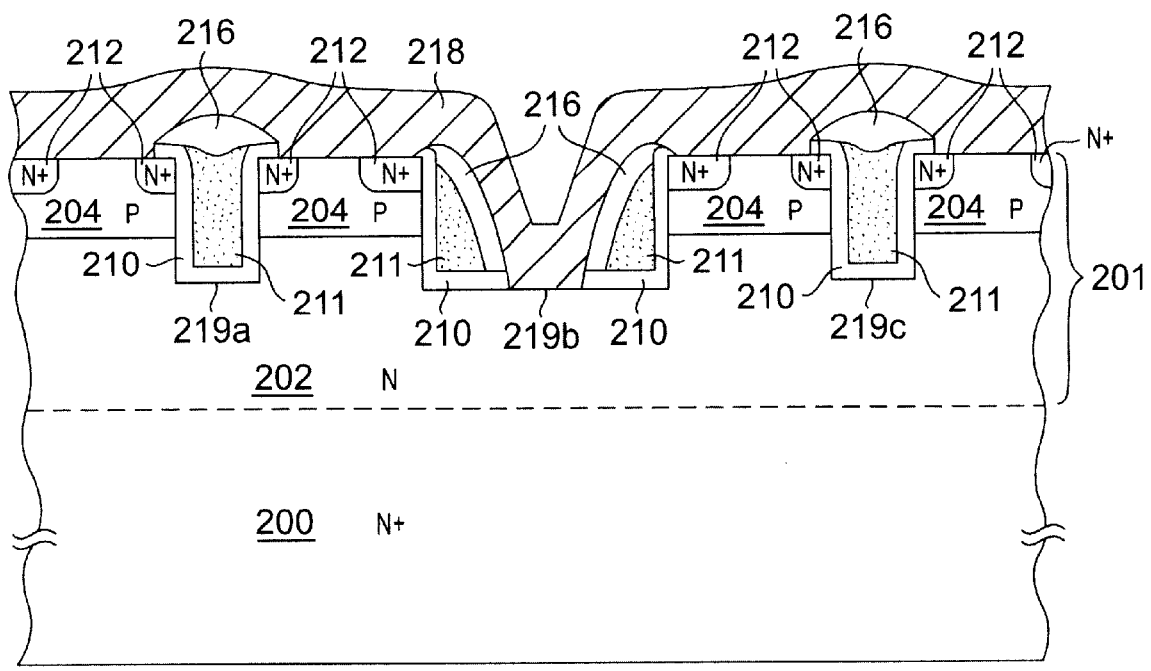

A layer of conductor 218 is deposited, preferably by sputtering. A conductor mask is then provided, followed by etching, for example by wet or plasma etch, to isolate various conductor regions from one another. For example, the conductor for the gate contact (not shown) is isolated from the conductor 218 for the source/body/Schottky-rectifying contacts in this step. The conductor 218 in this specific example is an aluminum alloy, either by itself or over a material such as titanium tungsten, or a material such as platinum silicide that has been formed in the contacts, as it provides a Schottky rectifying contact at the bottom of trench 219b, while providing an ohmic contact at source/body regions 212, 204. The resulting structure is illustrated in FIG. 6F.

Of course, myriad variations on the above theme are possible. As one example, while the source regions 212 are provided in the above example prior to trench formation, it is also common in the trench MOSFET art to provide the source regions after formation of the trench gate structure. As another example, although oxide regions 216 are used above to isolate the polysilicon regions 211 from conductor 218, BPSG is also commonly used for this purpose.

Figure 8:
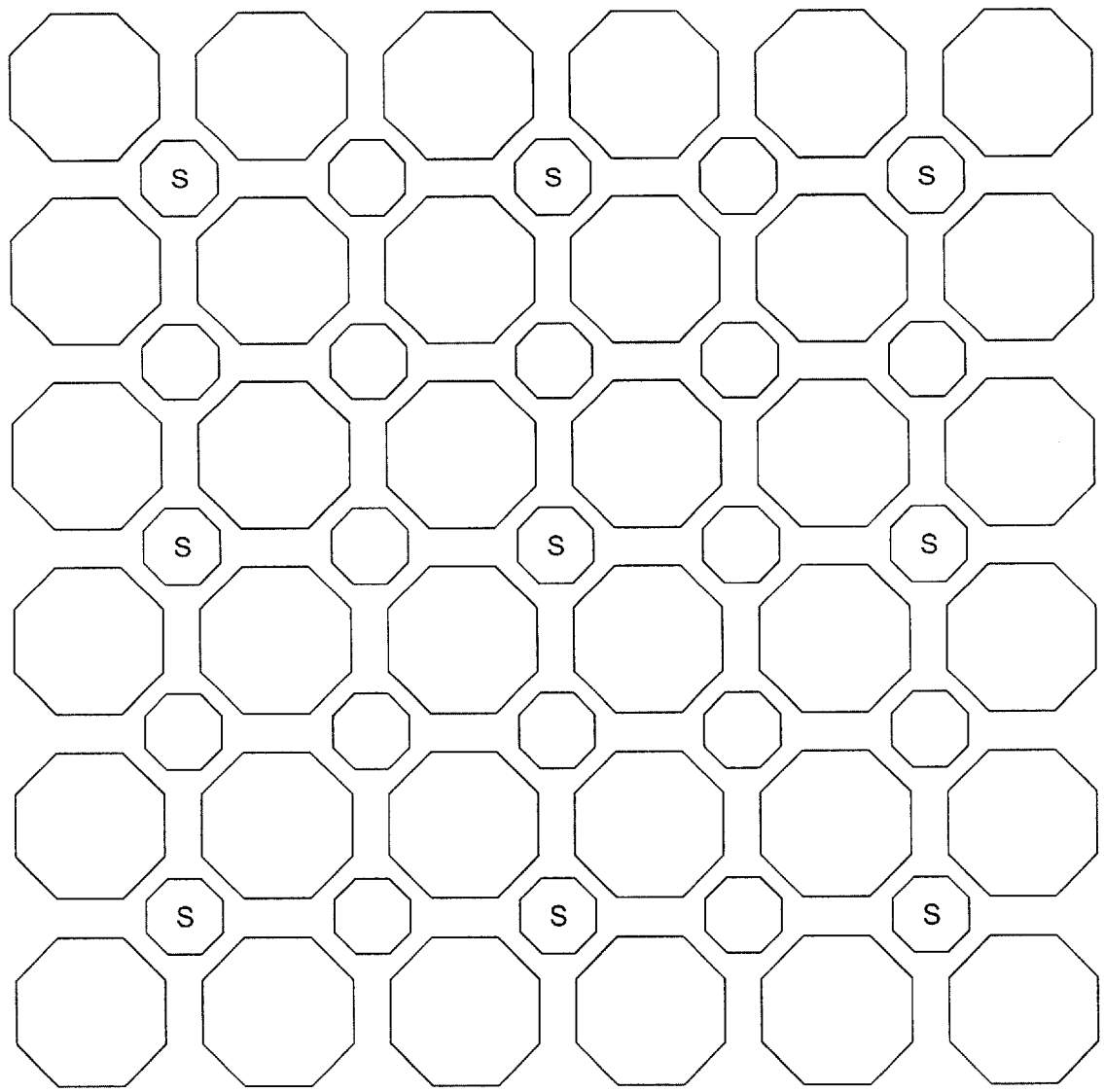
FIG. 8 is a schematic top view illustrating one cell geometry that may be used in connection with the merged MOSFET and Schottky diode structures of the present invention.

As noted above, the device design of the present invention can be implemented in connection with an essentially infinite variety of layouts in which DMOS transistors and Schottky diodes are integrated on the same silicon substrate. One particularly preferred layout is illustrated in FIG. 8 and is referred to herein as an "unpacked octagonal geometry". This design includes alternating rows of relatively large and small octagonal cells.

Figure 10:
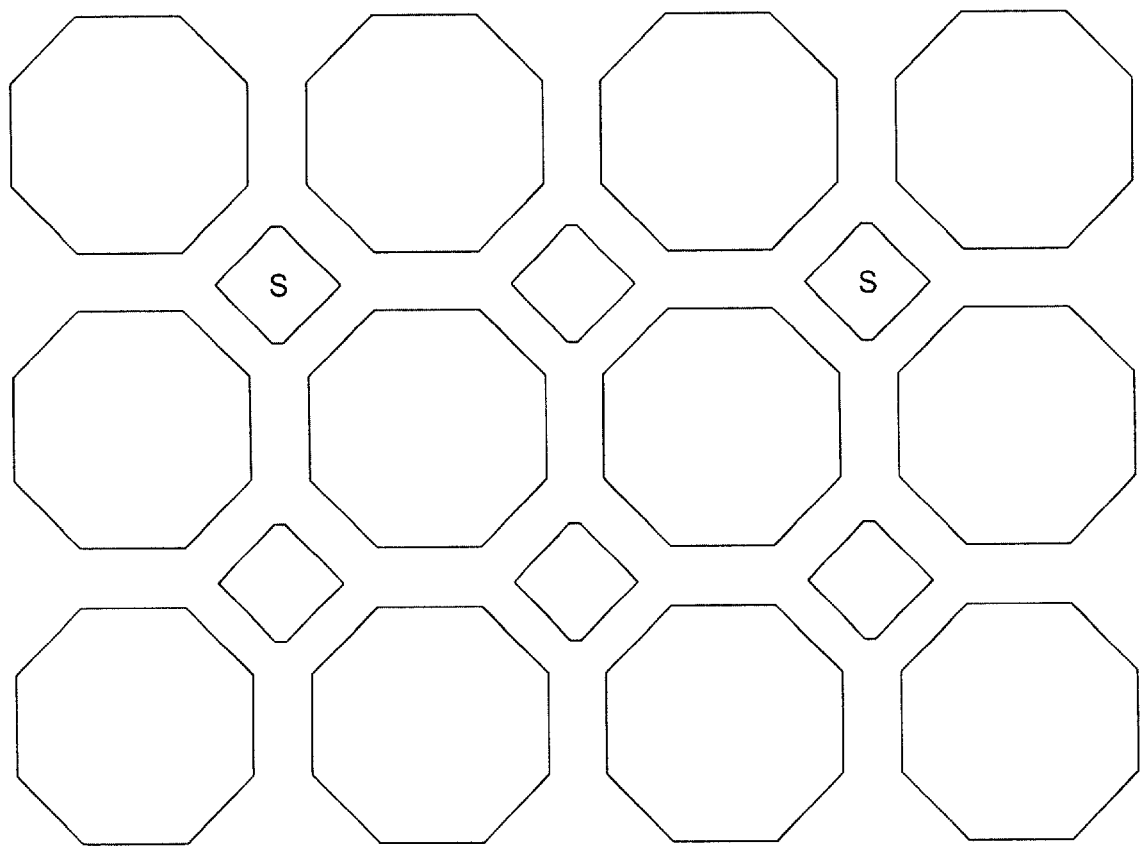
FIG. 10 is a schematic top view illustrating another cell geometry that may be used in connection with the merged MOSFET and Schottky diode structures of the present invention.

Numerous variations of the unpacked octagonal geometry design are possible. For example, in FIG. 8, the Schottky cells are illustrated in connection with the rows of relatively small cells, but the Schottky cells could also be provided in connection with the rows of relatively large cells. In addition, although octagonal cells are illustrated in connection with the relatively small cell rows in FIG. 8, it is noted that the small cells could also be, for example, square cells as illustrated in FIG. 10.

One parameter by which the merged devices of the present invention can be characterized is the ratio of source perimeter to Schottky diode conducting area. As can be seen from FIGS. 9A–9D, this ratio can be modified in various ways. For example, as can be seen from the design illustrated in FIG. 9D, the source perimeter for each of the large MOSFET mesas (four illustrated) is equal to (2×s1)+(2× s3)+(4×s2). The source perimeter for the small MOSFET mesas of FIG. 10 is approximately 8×s2. The area occupied by the Schottky diode (one illustrated and designated with an "S") in FIG. 10 is approximately (s2×s2). The unpacked octagon geometry illustrated allows the ratio of s2 to s1 as well as the ratio of s3 to s1 to be modified, within limits, which in turn allows great flexibility in dictating the ratio of source perimeter to the Schottky diode area.

Figure 9A:
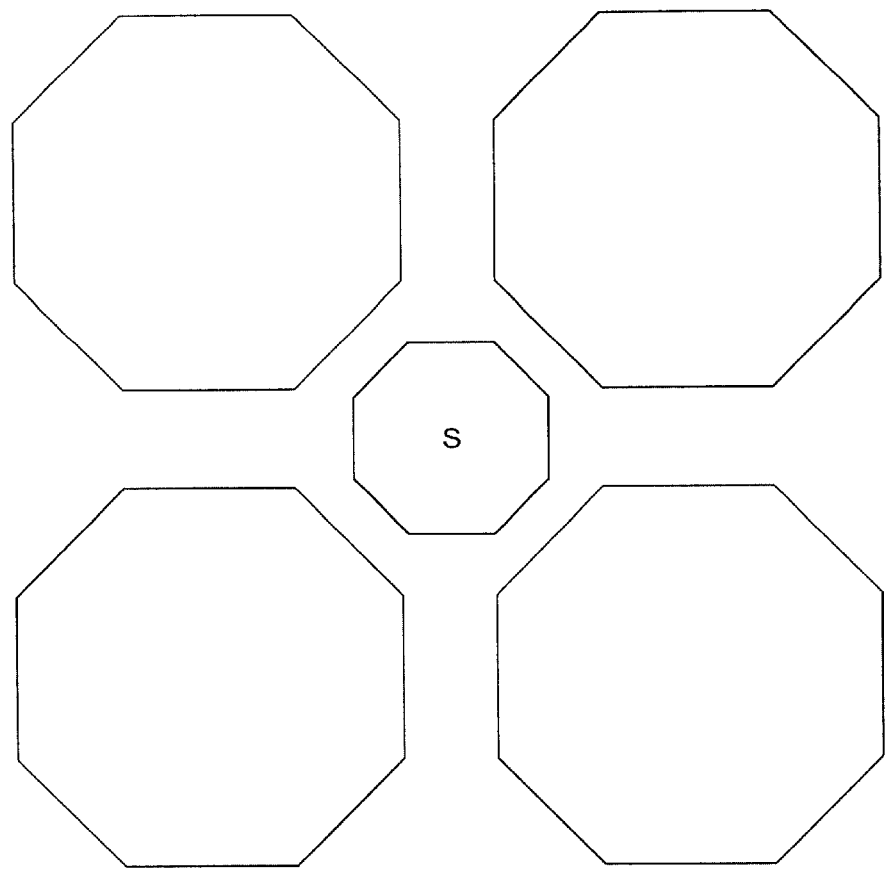
FIGS. 9A–9D are schematic top views illustrating various cell geometries that may be used in connection with the merged MOSFET and Schottky diode structures of the present invention.
Figure 9B:
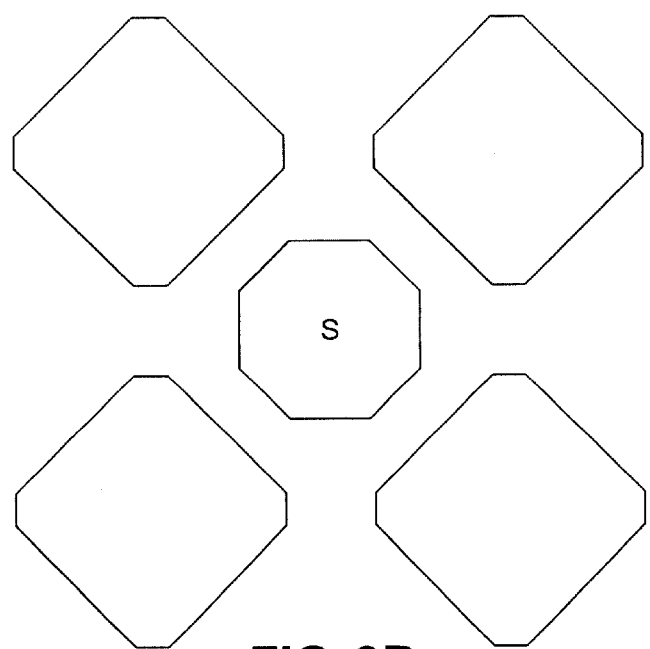

For example, a magnified view of five cells from the structure of FIG. 8 is illustrated in FIG. 9A. Each of these cells is a regular octagon. In FIG. 9B, however, the top, bottom, left and right sides (which correspond to lengths s1 and s3) are made significantly smaller than the diagonal sides (which correspond to length s2). As can be seen by comparing FIG. 9A with FIG. 9B, this acts to decrease the ratio of the source perimeter to Schottky diode area of the device of FIG. 9B, relative to the device of FIG. 9A.

Figure 9C:
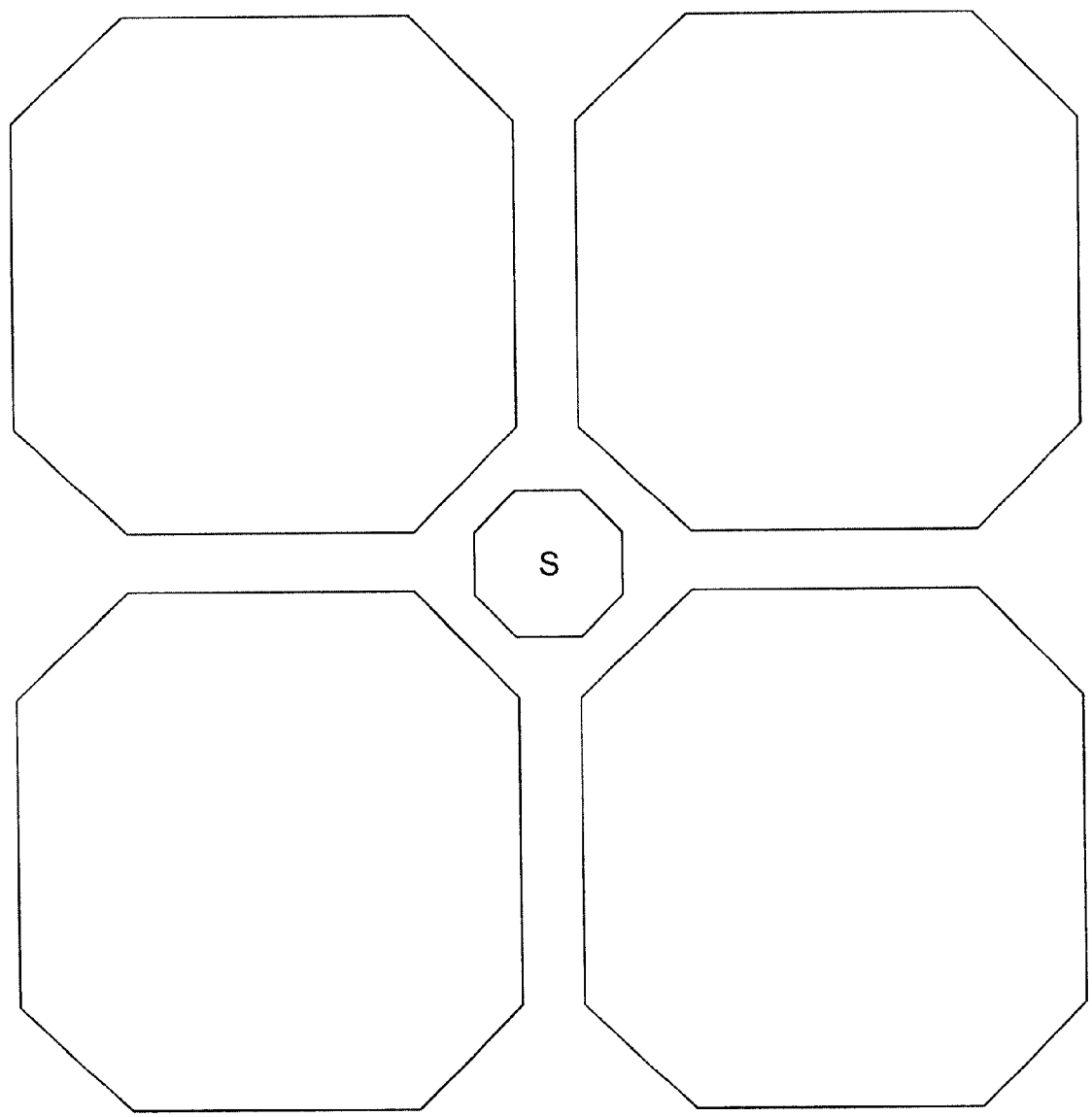

On the other hand, the top, bottom, left and right sides (which correspond to lengths s1 and s3) can also be significantly larger than the diagonal sides (which correspond to length s2) as illustrated in FIG. 9C. This acts to increase the ratio of the source perimeter to Schottky diode area of the device of FIG. 9C, relative to the device of FIG. 9A.

Figure 9D:
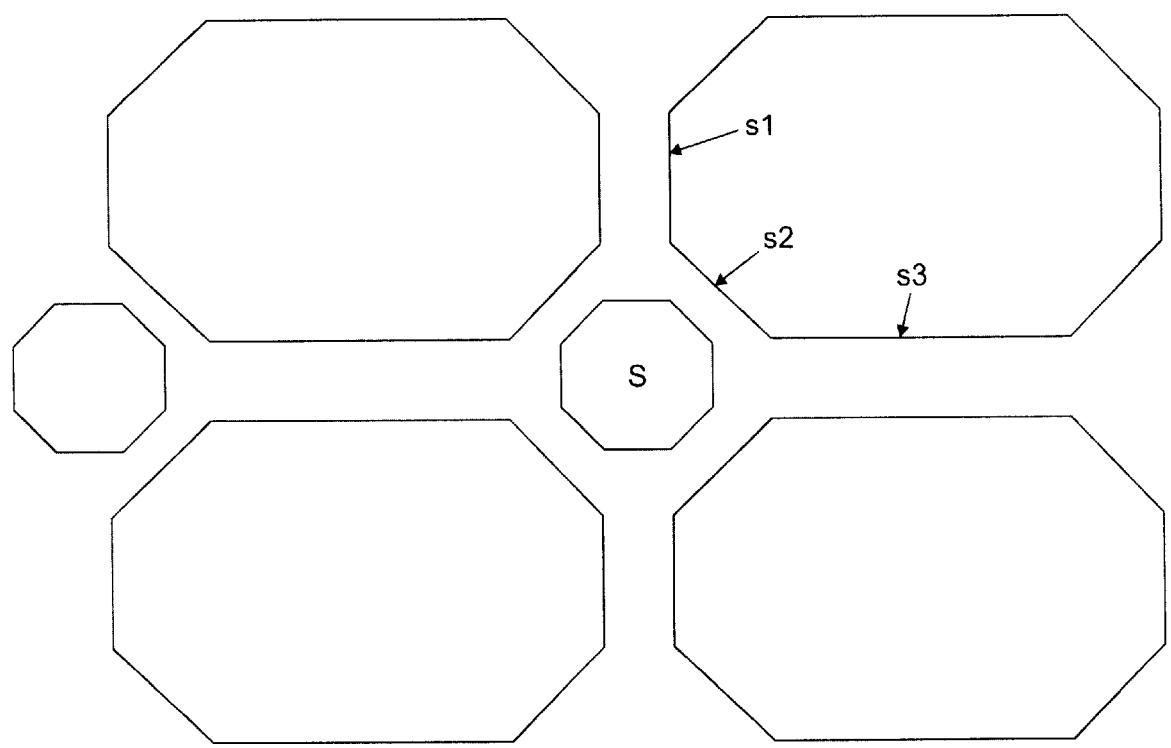

In other embodiments, it may be desirable to increase the size of only the top and bottom sides as is shown in FIG. 9D. Of course, the size of the left and right sides could also be increased in a similar fashion.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A merged device comprising:
    a plurality of MOSFET cells that comprise:
        (a) a source region of first conductivity type formed within an upper portion of a semiconductor region,
        (b) a body region of second conductivity type formed within a middle portion of said semiconductor region,
        (c) a drain region of first conductivity type formed within a lower portion of said semiconductor region, and
        (d) a gate region provided adjacent said source region, said body region, and said drain region; and
    a plurality of Schottky diode cells disposed at the bottom of a trench network, wherein said Schottky diode cells comprise a conductor portion in Schottky rectifying contact with said lower portion of said semiconductor region;
        wherein at least one gate region of said plurality of MOSFET cell is positioned along a sidewall of said trench network adjacent at least one Schottky diode cell.

2. The device of claim 1, wherein said gate region comprises a doped polysilicon region adjacent a silicon dioxide region.

3. The device of claim 1, wherein said first conductivity type is n-type conductivity and said second conductivity type is p-type conductivity.

4. The device of claim 3, further comprising a heavily doped contact region for contact to the body region.

5. The device of claim 3, further comprising a p-type region that is below the Schottky diode and contacts the perimeter of the Schottky diode.

6. The device of claim 1, wherein said semiconductor region is a silicon region.

7. The device of claim 6, wherein said semiconductor region is an epitaxial silicon region.

8. The device of claim 6, wherein said conductor portion in Schottky rectifying contact with said lower portion of said semiconductor region comprises one of the materials titanium-tungsten, platinum silicide, aluminum or aluminum alloy.

9. The device of claim 1, wherein at least one of said MOSFET cells is octagonal in shape.

10. A merged device comprising:
    a semiconductor substrate of first conductivity type;
    a semiconductor epitaxial layer disposed over said substrate;
    a trench network extending into said epitaxial region from an upper surface of said epitaxial layer and forming a plurality of mesas within said device;
    a plurality of MOSFET cells that comprise:
        (a) a source region of said first conductivity type disposed within one of said mesas,
        (b) a body region of second conductivity type disposed within said one of said mesas, said body region forming a junction with said source region,
        (c) a drain region of first conductivity type at least partially disposed within said one of said mesas, said drain region forming a junction with said body region; and
        (d) a gate region situated within said trench network such that it is adjacent said source region, said body region and said drain region, said gate region comprising (i) an insulating region lining at least a portion of said trench network and (ii) a conductive region within said trench network adjacent said insulating region, said conductive region being separated from said source, body and drain regions by said insulating region; and
    a plurality of Schottky diode cells formed at the bottom portions of said bench network, wherein said Schottky dioide cells comprise a conductor portion that is in Schottky rectifying contact with said epitaxial layer,
        wherein at least some of said gate regions of said MOSFET cells are positioned along sidewalls of said trench network adjacent said conductor portions of at least some of said Schottky diodes.

11. The device of claim 10, wherein said conductor makes ohmic contact with said source regions and said body regions.

12. The device of claim 11, wherein said conductor portion in Schottky rectifying contact with said lower portion of said semiconductor region comprises one of the materials titanium-tungsten, platinum silicide, aluminum or aluminum alloy.

13. The device of claim 10, wherein said gate region comprises a doped polysilicon region adjacent a silicon dioxide region.

14. The device of claim 10, wherein said first conductivity type is n-type conductivity and said second conductivity type is p-type conductivity.

15. The device of claim 14, further comprising a heavily doped contact region for contact to the body region.

16. The device of claim 14, further comprising a p-type region that is below the Schottky diode and contacts the perimeter of the Schottky diode.

17. The device of claim 10, wherein said semiconductor is silicon.

18. The device of claim 10, wherein at least some of said MOSFET cells and at least some of said Schottky diode cells are arranged in a geometric configuration selected from a group consisting of an in-line square geometry, an offset square geometry, and a hexagonal geometry.

19. The device of claim 10, wherein at least some of said MOSFET cells are octagonal cells.

20. The device of claim 10, wherein at least some of said MOSFET cells and at least some of said Schottky diode cells are arranged in a geometry comprising alternating first and second cell rows, wherein the cells of said first cell rows are greater in area than the cells of said second cell rows, and wherein said cells of said first cell rows are octagonal cells.

21. The device of claim 20, wherein said cells of said first cell rows are regular octagons.

22. The device of claim 20, wherein said MOSFET cells are positioned within said first cell rows and said Schottky diode cells are positioned within said second cell rows.

23. The device of claim 20, wherein said cells of said second cell rows are octagonal cells or square cells.

24. A merged device comprising Schottky diode cells and MOSFET cells, wherein said Schottky diode cells are located at the bottom of a trench network, wherein said Schottky diode cells comprise a gate conductor portion in Schottky rectifying contact at the bottom of the trench network, and wherein a portion of the gate conductive region and a portion of a gate insulation region of said MOSFET cells are provided on sidewalls of said trench network surrounding each Schottky rectifying contact.

25. A method of forming a merged device comprising:

forming a plurality of Schottky diode cells; and forming a plurality of MOSFET cells, wherein said Schottky diode cells are located at the bottom of a trench network, wherein gate regions of said MOSFET cells comprise a conductive region and an insulating region, wherein a portion of the sate conductive region and a portion of the gate insulation regions are provided on sidewalk of said trench network surrounding each Schottky rectifying contact, the Schottky rectifying contact located at the bottom of the trench network, and wherein said conductive region of said gate regions is formed without the aid of a masking layer.

26. The method of claim 25, wherein said gate conductive region is formed by etching a doped polysilicon layer in an anisotropic etching process.

* * * * *